(12) United States Patent
Kwon (10) Patent No.: US 6,771,098 B2
(45) Date of Patent: Aug. 3, 2004

(54) DATA OUTPUT BUFFER HAVING A PRESET STRUCTURE

(75) Inventor: Tae Woo Kwon, Kyungsangnam-Do (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/615,236

(22) Filed: Jul. 9, 2003

(65) Prior Publication Data

US 2004/0113664 A1 Jun. 17, 2004

(30) Foreign Application Priority Data

Dec. 13, 2002 (KR) ......................................... 2002-79605

(51) Int. Cl.[7] .............................................. H03B 1/00
(52) U.S. Cl. ....................... 327/108; 327/112; 327/391; 326/83; 326/87
(58) Field of Search ......................... 327/108–112, 170, 327/379, 389, 391; 326/26, 27, 82, 83, 87; 365/189.05, 230.08

(56) References Cited

U.S. PATENT DOCUMENTS 5,369,316 A * 11/1994 Chen et al. .................. 327/108
6,600,336 B2 * 7/2003 Kojima .......................... 326/27

* cited by examiner

*Primary Examiner*—Long Nguyen
(74) *Attorney, Agent, or Firm*—Jacobson Holman PLLC (57) ABSTRACT

Disclosed is a data output buffer having a preset structure. The data output buffer comprises a plurality of groups, each group having two data output buffers, a preset driver for precharging or discharging any one output of two output buffers in each group, a control circuit for generating a control signal to drive the preset driver when outputs of the two output buffers in each group are same, and a set circuit connected between the outputs of the two data output buffers in each group, for making the outputs of the two data output buffer in each group the same level. Therefore, a data output speed of the data output buffer could be improved and the peak current could be also reduced.

6 Claims, 10 Drawing Sheets

DATA OUTPUT BUFFER HAVING A PRESET STRUCTURE

BACKGROUND OF THE INVENTION

1. Field of the Invention

The present invention relates to a data output buffer for semiconductor devices, and more particularly, to a data output buffer having a present structure.

2. Background of the Related Art

Figure 1:
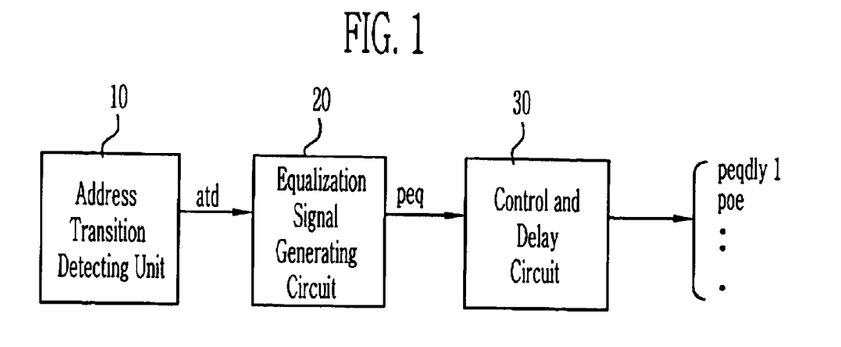
FIG. 1 is a block diagram for generating a control signal for use in semiconductor devices.

FIG. 1 is a block diagram for generating a control signal for use in semiconductor devices.

An address transition detecting unit 10 senses when an inputted address is shifted to generate an address transition detection signal atd. An equalization signal generating circuit 20 generates an equalization signal peq according to the address transition detection signal atd. A control and delay circuit 30 generates various control signals and delay signals (peqdly, poe . . . ) according to the inputted equalization signal peq.

Figure 2:
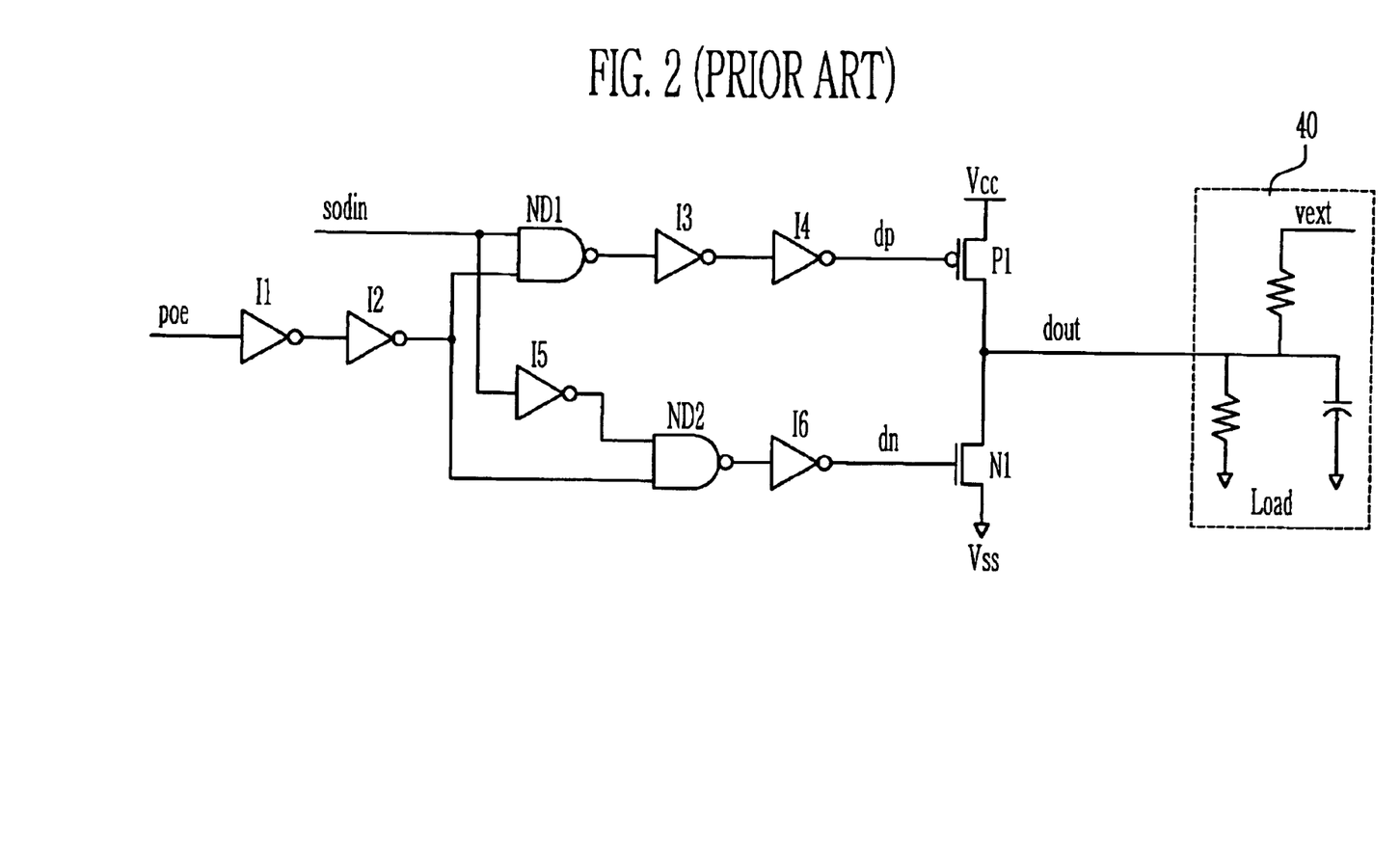
FIG. 2 is a detailed circuit diagram of a conventional data output buffer.
Figure 3:
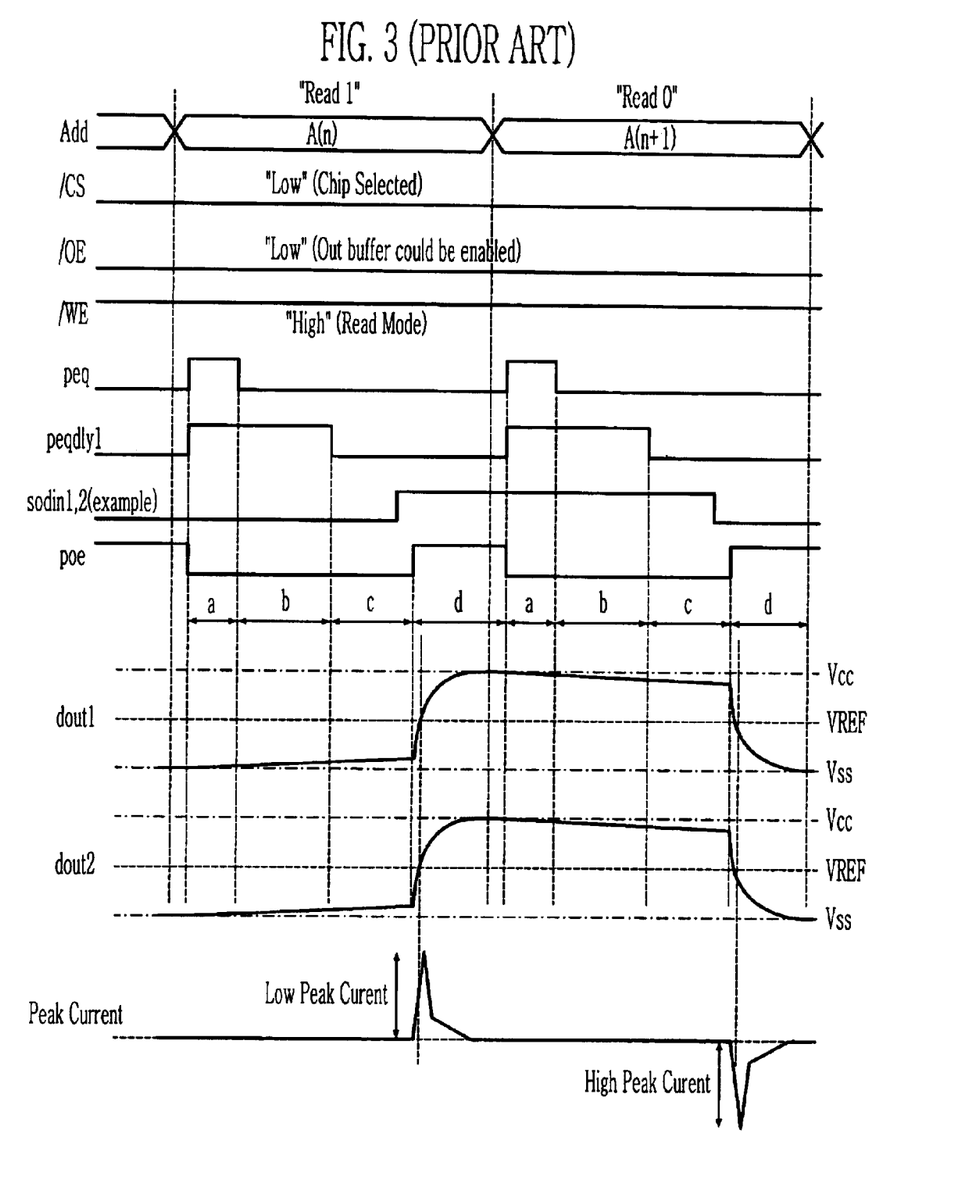
FIG. 3 illustrates a waveform for explaining the operations of the prior art data output buffer

FIG. 2 is a detailed circuit diagram of a conventional data output buffer. The operation of the data output buffer will be described by reference to FIG. 3. In FIG. 3, an address Add, a chip select signal/CS, an output enable signal/OE and a write enable signal/WE are signals used for the operation of the common semiconductor memory devices.

FIG. 2 has a structure in which in a given period of time after transition of an address is detected in a read operation and a read cycle then begins, a data sodin from a sense amplifier (not shown) reaches a data output buffer and at once a pulse output enable signal poe operates the data output buffer, which then outputs a data. This will be described in detail below.

If the read operation begins, the output signal sodin of the sense amplifier reaches the data output buffer. As the pulse output enable signal poe through inverters I1 and I2 is at a LOW level, that is, the outputs of NAND gates ND1 and ND2 are at HIGH levels in a standby mode, PMOS and NMOS transistors P1 and N1 are turned off. Thus, the output dout is changed to a HIGH impedance level by an external termination circuit 40. Thereafter, if the pulse output enable signal poe becomes HIGH, the output sodin of the sense amplifier is transferred to the output dout. If the output sodin of the sense amplifier is HIGH, the output of the NAND gate ND1 becomes LOW. The signal of the LOW level is applied to the gate terminal of the PMOS transistor P1 via the inverters I3 and I4. Accordingly, the PMOS transistor P1 is turned on, so that the output dout becomes HIGH.

On the contrary, the output of the NAND gate ND2 becomes HIGH. The signal of the HIGH level is inverted by the inverter I6 and is then applied to the gate terminal of the NMOS transistor N1. Therefore, the NMOS transistor N1 is turned off.

This type of the data output buffer has an external load and a rapid read cycle. Furthermore, if this data output buffer has to output data opposite to data of the previous cycle, the output dout must largely swing from 0V to Vcc. Therefore, there is a possibility that noise may occur due to delayed speed and increased peak current. In particular, if the data output buffer is constructed in a wide bit and has to output a plurality of data at the same time, the output dout is changed from a LOW level to a HIGH level or HIGH level to LOW level. Therefore, generation of noise due to increased peak current is inevitable.

SUMMARY OF THE INVENTION

Accordingly, the present invention is contrived to substantially obviate one or more problems due to limitations and disadvantages of the related art.

An object of the present invention is to provide a data output buffer having a preset structure in which the output of the data output buffer is preset to an intermediate level in advance and is then converted to an effective data level depending on an input data.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a data output buffer having a preset structure according to the present invention is characterized in that it comprises a plurality of groups, each group having two data output buffers, a preset driver for precharging or discharging any one output of two output buffers in each group, a control circuit for generating a control signal to drive the preset driver when outputs of the two output buffers in each group are same, and a set circuit connected between the outputs of the two data output buffers in each group, for making the outputs of the two data output buffer in each group the same level.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Figure 6:
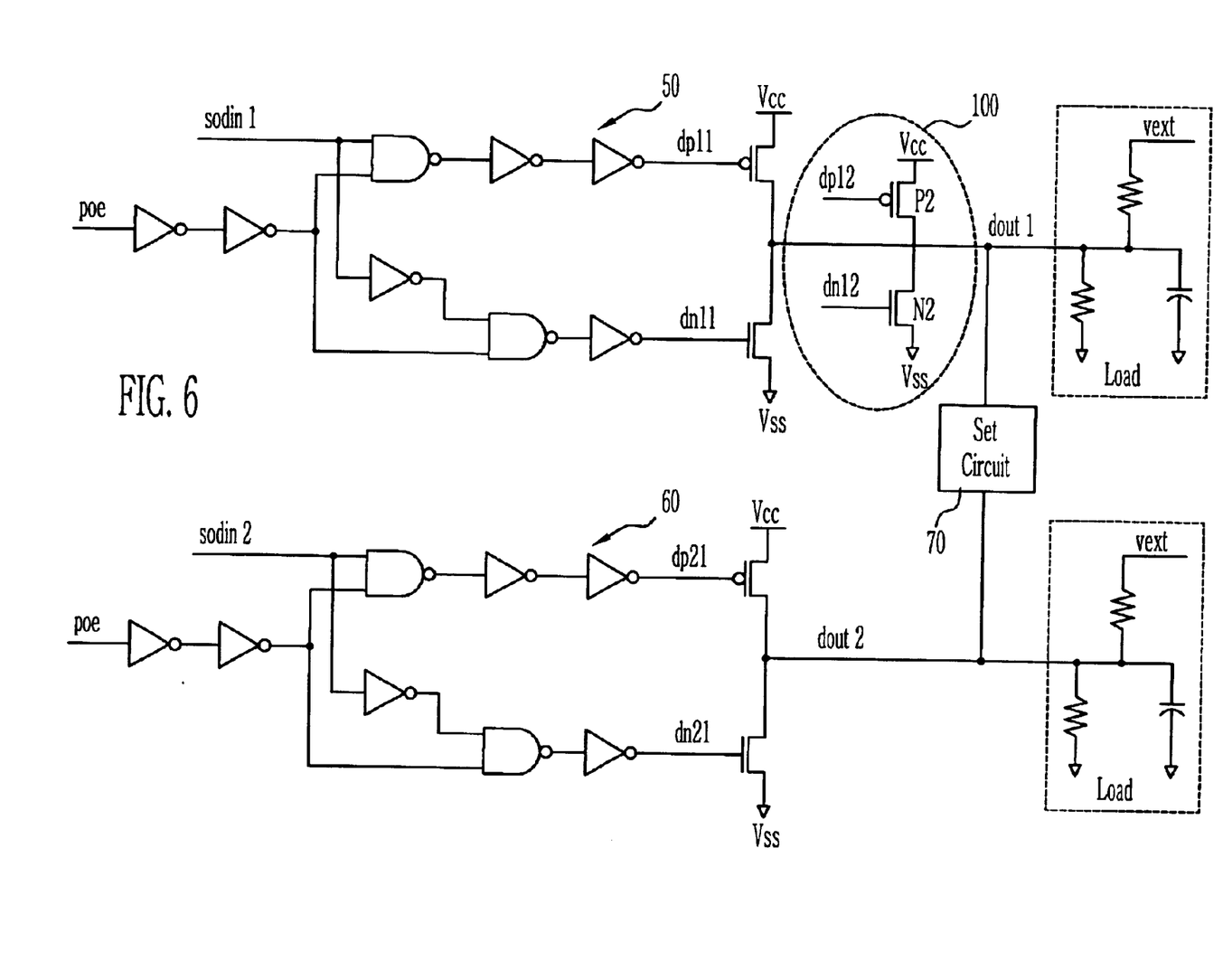
FIG. 6 is a detailed circuit diagram of a data output buffer according to the present invention.

FIG. 6 is a detailed circuit diagram of a data output buffer having a preset structure according to the present invention.

The data output buffer is constructed in plural. In the present invention, the data output buffer is divided into an odd data output buffer and an eves data output buffer. As shown in FIG. 6, a preset driver 100 is connected to the output dout1 of the odd data output buffer 50. The even data output buffer 60 has the same construction to the prior art. Furthermore, the output dout1 of the odd data output buffer 50 and the output dout2 of the even data output buffer 60 are connected each other through a set circuit 70. Although only two data output buffers are shown in FIG. 6, those having skill in the art will appreciated that the data output buffer may be constructed in plural numbers such as 4, 16, 32, or the like. Even in this case, the odd data output buffer includes the preset driver 100 and the even data output buffer has the same construction to the prior art. Also, the output dout1 of the odd data output buffer 50 and the output dout2 of the even data output buffer 60 are connected each other in pairs by the set circuit 70.

Figure 10:
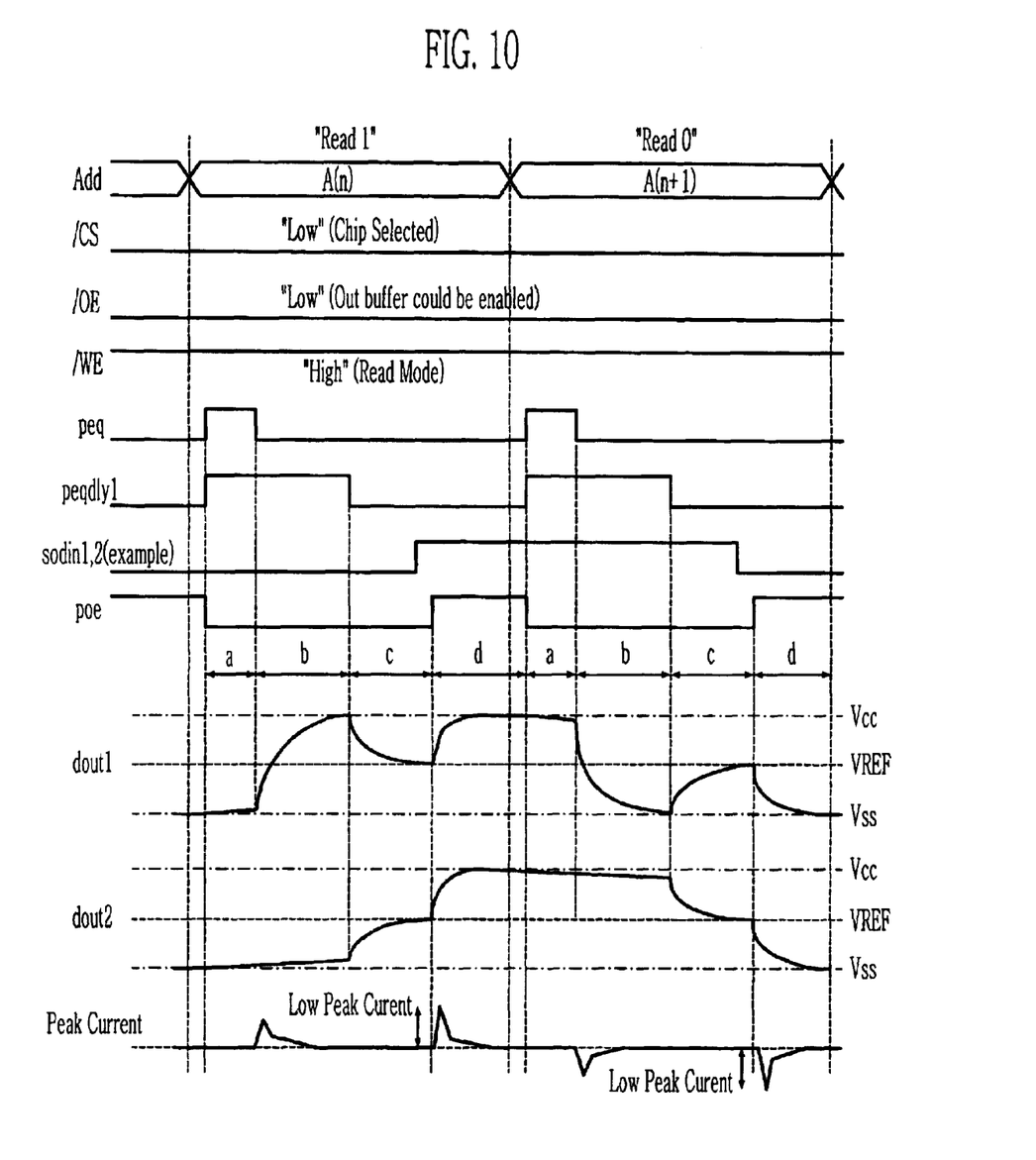
FIG. 10 illustrates a waveform for explaining the operations of the data output buffer according to the present invention.

A basic principle of the present invention will be now described by is reference to FIG. 6 and FIG. 10.

The operation of the present invention may be classified into four steps in large part. In other words, there are an evaluation step (a), a preset step (b), a set step (c) and an output step (d), as shown in FIG. 10.

Before the operation of the four steps is explained, the operation of the odd data output buffer 50 will be first described. The construction except for the preset driver 100 is same to that of the prior art. For simplicity, explanation on respective elements will be omitted.

The preset driver 100 comprises the PMOS transistor P2 connected between the power supply Vcc and the output dout1 and turned on by the control signal dp12, and the NMOS transistor N2 connected between the output dout2 and the ground Vss and turned on by the control signal dn12.

Figure 7:
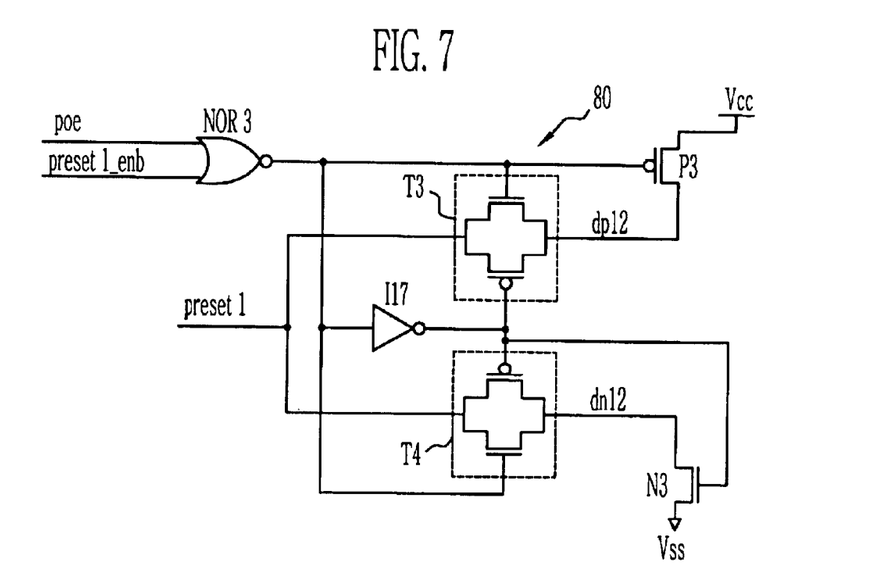
FIG. 7 is a detailed circuit diagram of a present unit in FIG. 6.

The preset driver 100 is driven by the output of the preset circuit 80 shown in FIG. 7. The preset circuit 80 is driven by the output of the evaluation circuit 90 in FIG. 8. Accordingly, the evaluation circuit 90, the preset circuit 80 and the preset driver 100 will be sequentially explained.

Figure 8:
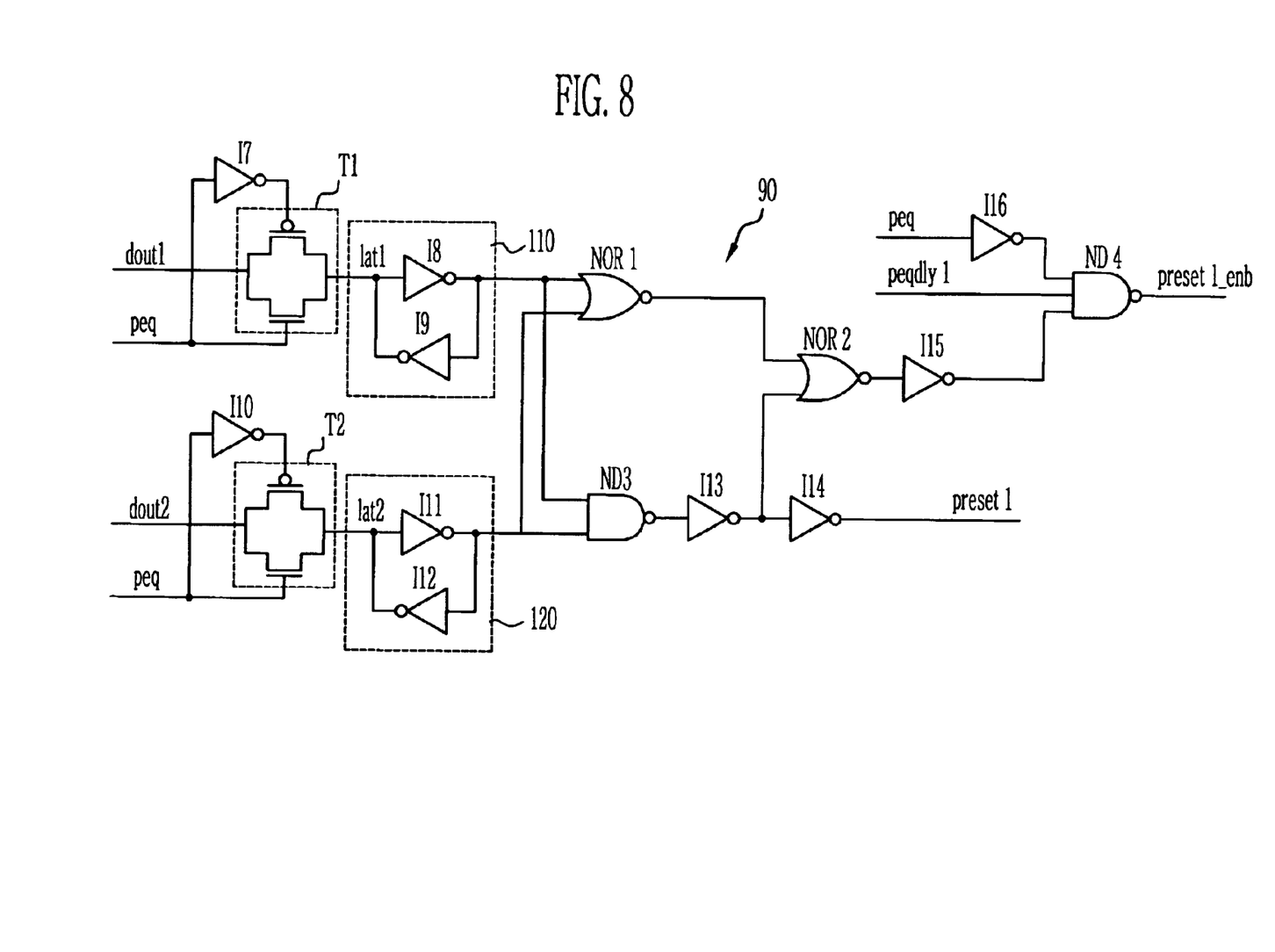
FIG. 8 illustrates an evaluation circuit for driving the present unit of FIG. 7.

The evaluation circuit 90 generates a preset signal preset1 and a preset enable signal preset1_enb according to the output signaldout1 of the odd data output buffer, the output signal dout2 of the even data output buffer and the equalization signal peq in FIG. 1.

This may be summarized as in the following Table 1 below.

TABLE 1

|  | 1 | 2 | 3 | 4 |
|---|---|---|---|---|
| dout1 | H | L | H | L |
| dout2 | H | L | L | H |
| preset1_enb | L | L | H | H |
| preset1 | H | L | X | X |

As shown in Table 1, if both the output dout1 of the odd data output buffer and the output dout2 of the even data output buffer are HIGH, the preset enable signal preset1_ enb is enabled to be LOW and the preset signal preset1 becomes HIGH. Furthermore, both the output dout1 of the odd data output buffer and the output dout2 of the even data output buffer are LOW, the preset enable signal preset1_enb is enable to be LOW and the preset signal preset1 becomes LOW.

If the output dout1 of the odd data output buffer and the output dout2 of the even data output buffer are different, the preset enable signal preset1_enb is disabled to be HIGH, whereby the preset driver 100 does not operate.

The operation of the respective elements will be described taking a case where both the output dout1 of the odd data output buffer and the output dout2 of the even data output buffer are HIGH as an example.

A transmission gate T1 is turned on by the equalization signal peq and a signal inverted by the inverter 17 and the output dout1 is thus latched to a first latch 110 consisting of inverters 18 and 19.

A transmission gate T2 is turned on by the equalization signal peq and a signal inverted by an inverter I11 and the output dout2 is thus latched to a second latch 120 consisting of inverters I11 and I12.

As both the outputs dout1 and dout2 are HIGH, both the outputs of the first and second latches 110 and 120 become LOW. As both the outputs of a NOR gate NOR1 and a NAND gate ND3 are HIGH, the signal through the inverters 13 and 14 becomes HIGH. Therefore, the preset signal preset1 becomes HIGH.

Figure 4:
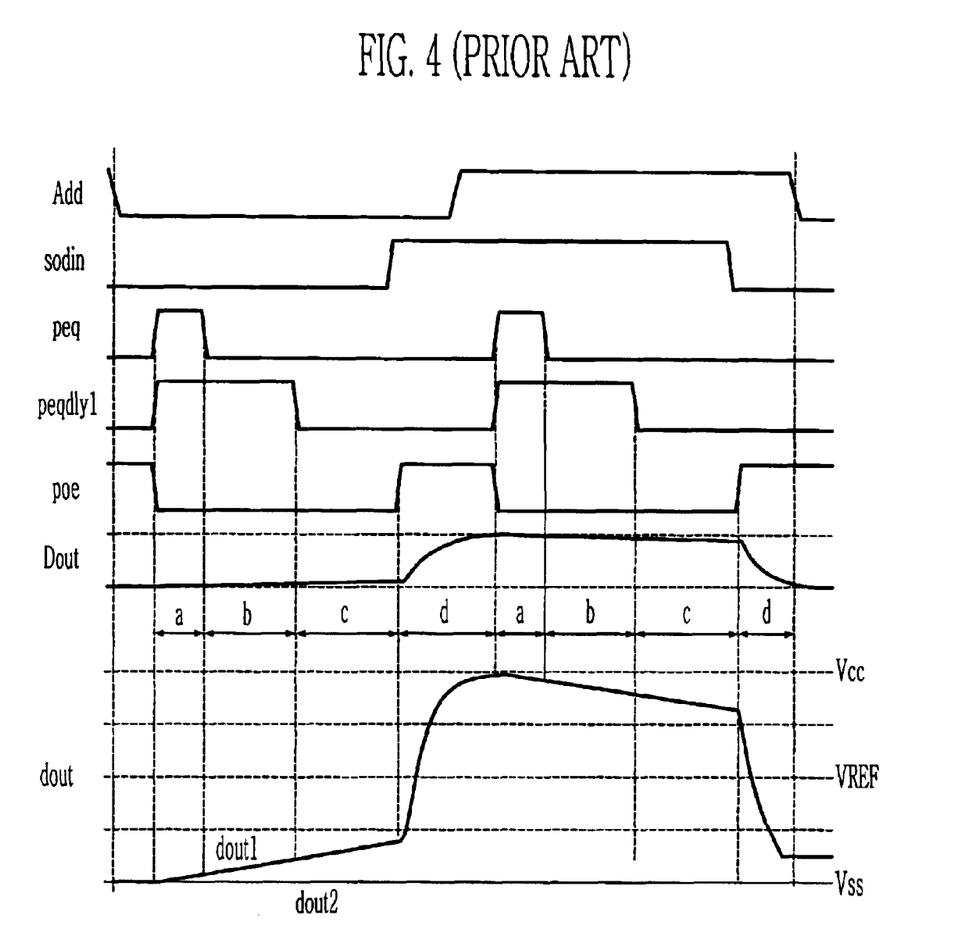
FIG. 4 illustrates a simulation result waveform of the prior art data output buffer.

As the output of the inverter I13 is LOW, the output of the NOR gate NOR2 becomes LOW. As all of the output of the inverter I15, the delayed equalization signal peqdly1 and the equalization signal inverted by the inverter I16 are HIGH, the output of the NAND gate ND4 becomes LOW. Accordingly, the preset enable signal preset1_enb becomes LOW. The operation of the preset circuit will be now described by reference to FIG. 4.

The preset circuit 80 drives the preset driver 100 to make the preset signal preset1 control signals dp12 and dn12 in a period when the pulse output enable signal poe is disabled to be LOW and the data output buffer does not output an effective data.

In case where the pulse output enable signal poe is enabled to be HIGH or the preset enable signal preset1_enb is disabled to be HIGH, the preset driver 100 is disabled. This will be described in more detail by reference to the preset circuit of FIG. 7.

If the pulse output enable signal poe is LOW and the preset enable signal preset1_enb of FIG. 8 is LOW, the output of the NOR gate NOR3 becomes HIGH. Therefore, a PMOS transistor P3 is turned off and transmission gates T3 and T4 are turned on. Furthermore, a NMOS transistor N3 is turned off by the output of the inverter I17. Therefore, the preset signal preset1 becomes the control signals dp12 and dn12. In other words, if the preset signal preset1 is LOW, the control signals dp12 and dn12 become LOW. The NMOS transistor N2 of the present driving circuit 100 in FIG. 6 is turned off but the PMOS transistor P2 is turned on, so that the output dout1 is precharged with the power supply voltage Vcc. On the contrary, if the preset signal preset1 is HIGH, the NMOS transistor N2 is turned on but the PMOS transistor P2 is turned off, so that the output dout1 is discharged.

Meanwhile, if the pulse output enable signal poe is enabled to be HIGH and is being outputted, or though the pulse output enable signal poe is LOW, the pulse output enable signal poe corresponds to 3 and 4 columns in Table 1 as the result of evaluation, the preset operation is not necessary and the set operation only is necessary, the transmission gates T3 and T4 are turned off, and the PMOS transistor P3 and the NMOS transistor N3 are turned on. As the control signal dp12 becomes HIGH and control signal dn12 becomes LOW, both the transistors N2 and P2 are turned off. For reference, when the pulse output enable signal poe is enabled, the transistors P2 and N2 must have been disabled.

The operation of the set circuit will be now described by reference to FIG. 6.

The output dout1 of the odd data output buffer 50 and the output dout2 of the even data output buffer 60 are connected each other according to the operation of the transmission gate T5.

In other words, if the equalization signal peqdly1 delayed in a period where the pulse output enable signal poe is disabled to be LOW and the data output buffers 50 and 60 do not output effective data, is LOW, the output of the NOR gate NOR4 becomes HIGH. Therefore, the signal through the inverters I18 and I19 becomes HIGH and the output of the inverter I9 becomes LOW. The transmission gate T5 is thus turned on. Accordingly, the outputs dout1 and dout2 of the odd and even data output buffers 50 and 60 are shorted. As described above, if the control signal dp12 of the preset circuit 80 is LOW, the PMOS transistor P2 of the preset driver 100 is turned on. If the output dout1 of the odd data output buffer 50 was thus charged with the power supply voltage Vcc, the outputs dout1 and dout2 of the odd and even data output buffers 50 and 60 become ½ Vcc by the operation of the set circuit 70. If the pulse output enable signal poe is enabled to be HIGH in a state that the outputs dout1 and dout2 are precharged with ½ Vcc, an effective data is outputted according to the data from the sense amplifier.

The evaluation step (a), the preset step (b), the set step (c) and the output step (d), being the basic four steps of the present invention, will be described based on the above explanation.

1. Evaluation Step ((a) period in FIG. 10)

In a period where the equalization signal peq is HIGH, the output dout1 of the odd data output buffer 50 and the output dout2 of the even data output buffer 60 are evaluated using the evaluation circuit 90 in FIG. 8, thus generating the preset enable signal preset1_enb and the preset signal preset1, as in Table 1.

2. Preset Step ((b) period in FIG. 10)

In a period where the equalization signal peq is LOW and the delayed equalization signal peqdly1 is HIGH, the preset driver 100 of FIG. 6 is driven by the output of the preset circuit 80 in FIG. 7. (the present driver 100 is driven when both the outputs dout1 and dout2 are HIGH or LOW). For this reason, the output dout1 of the odd data output buffer 50 is precharged with the power supply voltage Vcc.

3. Set Step ((c) period in FIG. 10)

Figure 9:
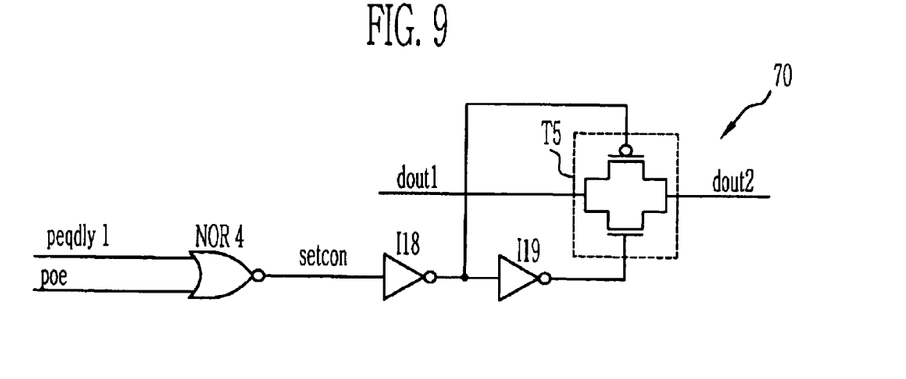
FIG. 9 illustrates a set circuit for equalizing the outputs of an odd data output buffer and an even data output buffer according to the present invention.

In a period where both the equalization signal peq and the pulse output enable signal poe are LOW, the outputs dout1 and dout2 are connected through the set circuit 70 in FIG. 9, whereby the outputs dout1 and dout2 make ½ Vcc.

4. Output Step ((d) period in FIG. 10)

As the pulse output enable signal poe is enabled to be HIGH, an actual data of the output sodin of the sense amplifier is outputted.

Figure 11:
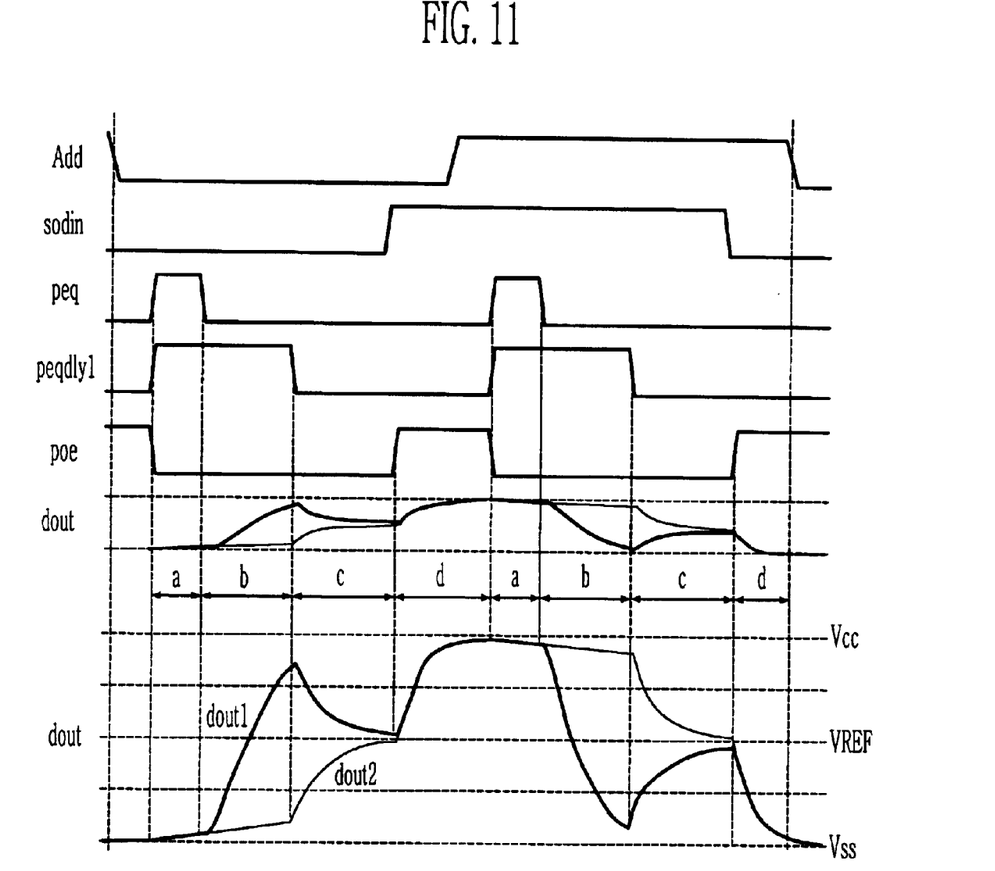
FIG. 11 illustrates a simulation result waveform of the data output buffer according to the present invention.

FIG. 11 illustrates a simulation result waveform of the data output buffer according to the present invention and a simulating result waveform of the prior art data output buffer. From FIG. 11, it can be seen that the output of the data output buffer in the present invention is rapidly changed than those in the prior art.

Figure 5:
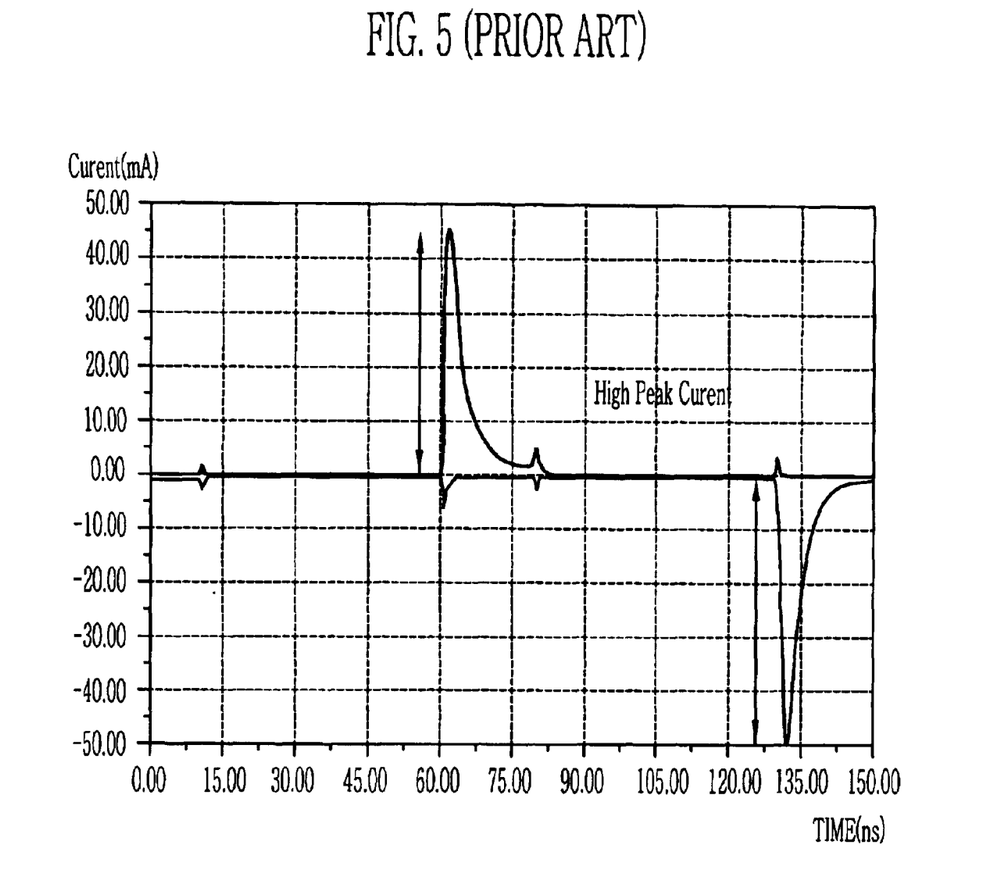
FIG. 5 illustrates a waveform showing the output current of the prior art data output buffer.
Figure 12:
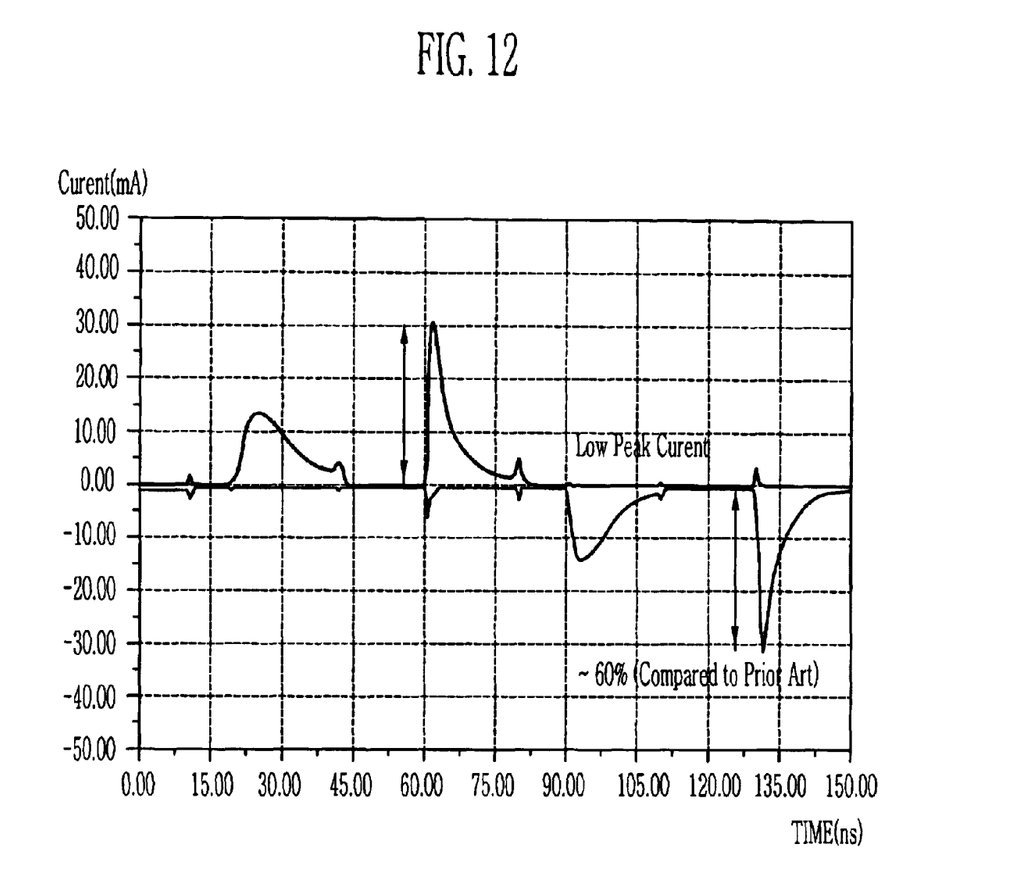
FIG. 12 illustrates a waveform showing the output current of the data output buffer according to the present invention.

FIG. 12 illustrates a waveform showing the output current of the data output buffer according to the present invention. FIG. 5 illustrates a waveform showing the output current of the prior art data output buffer.

From FIG. 12 and FIG. 5, it can be seen that the peak current of the data output buffer according to the present invention flows by about below 60% than those in the prior art.

As described above, the present invention has new effects that it can improve a data output speed of the data output buffer and reduce the peak current.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A data output buffer system having a preset structure, comprising:

a plurality of groups, each group having two data output buffers;

a preset driver for precharging or discharging any one of outputs of the two data output buffers in each group;

a control circuit for generating a control signal to drive the preset driver when the outputs of the two data output buffers in each group are same; and a set circuit connected between the outputs of the two data output buffers in each group, for making the outputs of the two data output buffers in each group the same level.

2. The data output buffer system having a preset structure as claimed in claim 1, wherein the preset driver comprises:

a first switching device for precharging the one of the outputs of the two data output buffers in each group with Vcc according to a first driving signal of the control signal; and a second switching device for discharging the one of the outputs according to a second driving signal of the control signal.

3. The data output buffer system having a preset structure as claimed in claim 1, wherein the control circuit comprises:

an evaluation circuit for generating a preset signal and a preset enable signal depending on whether the outputs of the two data output buffers in each group are same; and a preset circuit for generating a first driving signal of the control signal and a second driving signal of the control signal according to the preset signal and the preset enable signal of the evaluation circuit.

4. The data output buffer system having a preset structure as claimed in claim 1, wherein the set circuit comprises a third switching device for connecting the outputs of the two data output buffers in each group before the two data output buffers in each group output effective data.

5. The data output buffer system having a preset structure as claimed in claim 3, wherein the evaluation circuit comprises:

a first switching device for transmitting the one of the outputs of the two data output buffers in each group according to a first control signal;

a first latch for latching the output of the first switching device;

a second transmitting device for transmitting a remaining output of the outputs of the two data output buffers in each group according to the first control signal;

a second latch for latching the output of the second switching device;

a first NOR gate for performing a NOR operation on the outputs of the first and second latches;

a first NAND gate for performing a NAND operation on the outputs of the first and second latches;

a first inverter for inverting the output of the first NAND gate;

a second inverter for inverting the output of the first inverter to generate the preset signal;

a second NOR gate for performing a NOR operation on the output of the first NOR gate and the output of the first inverter;

a second NAND gate for performing a NAND operation on an inverted signal of the second NOR gate, an inverted first control signal and a delayed first control signal to generate the preset enable signal.

6. The data output buffer system having a preset structure as claimed in claim 3, wherein the preset circuit comprises:

a NOR gate for performing a NOR operation on the preset enable signal and a second control signal;

a first inverter for inverting the output of the NOR gate;

a first switching device that is turned on according to the output of the NOR gate and the output of the first inverter;

a second switching device that is turned on according to the output of the NOR gate and the output of the first inverter;

a third switching device that is switched according to the output of the NOR gate, thereby making the preset signal same as the first driving signal; and a fourth switching device that is switched according to the output of the first inverter, thereby making the preset signal same as the second driving signal.

* * * * *